(12) United States Patent
Philipp

(10) Patent No.: US 7,830,160 B2
(45) Date of Patent: Nov. 9, 2010

(54) CAPACITIVE POSITION SENSOR

(75) Inventor: Harald Philipp, Hamble (GB)

(73) Assignee: Atmel, Corporation, San Jose, CA (US)

( * ) Notice: Subject to any disclaimer, the term of this patent is extended or adjusted under 35 U.S.C. 154(b) by 0 days.

(21) Appl. No.: 12/317,305

(22) Filed: Dec. 22, 2008

(65) Prior Publication Data

US 2009/0115431 A1    May 7, 2009

Related U.S. Application Data

(63) Continuation-in-part of application No. 11/868,566, filed on Oct. 8, 2007.

(60) Provisional application No. 60/862,358, filed on Oct. 20, 2006.

(51) Int. Cl.
*G01R 27/26* (2006.01)

(52) U.S. Cl. ...................... 324/686; 324/690

(58) Field of Classification Search ............ 324/686, 324/690; 345/173
See application file for complete search history.

(56) References Cited

U.S. PATENT DOCUMENTS

| | | | |
|---|---|---|---|
| 4,121,204 A | 10/1978 | Welch et al. | |
| 4,264,903 A | 4/1981 | Bigelow | |
| 2003/0043174 A1 | 3/2003 | Hinckley et al. | |
| 2004/0027395 A1 | 2/2004 | Lection et al. | |
| 2004/0196267 A1 | 10/2004 | Kawai et al. | |
| 2004/0207605 A1* | 10/2004 | Mackey et al. | 345/173 |
| 2005/0052429 A1 | 3/2005 | Philipp | |
| 2005/0078027 A1 | 4/2005 | Philipp | |
| 2006/0016800 A1 | 1/2006 | Paradiso et al. | |
| 2008/0094077 A1 | 4/2008 | Philipp | |

2010/0141277 A1    6/2010   Philipp

FOREIGN PATENT DOCUMENTS

| | | |
|---|---|---|
| DE | 19645907 A1 | 5/1998 |
| DE | 19903300 A1 | 8/1999 |

(Continued)

OTHER PUBLICATIONS

UK Intellectual Property Office, Combined Search and Examination Report in UK application corresponding to U.S. Appl. No. 11/868,566, mailed Feb. 2, 2008.

(Continued)

*Primary Examiner*—Vincent Q Nguyen
(74) *Attorney, Agent, or Firm*—Schwegman, Lundberg & Woessner, P.A.

(57) ABSTRACT

A capacitive touch sensor is provided having sensing path for setting a color parameter to a desired value within a range, the color parameter being color hue, color saturation or color temperature. The sensor includes a sensing element having a sensing path, a terminal connecting the sensing element to a sensing channel, and a processor configured to interpret a signal indicative of a capacitance of the terminal. The processor has a first mode configured to set a parameter to a desired value. The desired value is related to a first position of an object sensed along the sensing path and a range of parameter values mapped to a length of the sensing path. A second mode adjusts the parameter based on a displacement of the object along the sensing path.

25 Claims, 5 Drawing Sheets

FOREIGN PATENT DOCUMENTS

| | | | |
|---|---|---|---|
| EP | 1273851 | A2 | 1/2003 |
| EP | 1602882 | A1 | 12/2005 |
| GB | 2443296 | A | 4/2008 |
| WO | 03/088176 | A1 | 1/2003 |
| WO | WO-2006133976 | A1 | 12/2006 |
| WO | WO-2007006624 | A1 | 1/2007 |
| WO | WO-2007023067 | A1 | 3/2007 |
| WO | WO-2007072294 | A1 | 6/2007 |

OTHER PUBLICATIONS

"U.S. Appl. No. 11/868,566, Non-Final Office Action mailed Oct. 1, 2009", 19 pages.

"International Application Serial No. PCT/US2009/069322, Search Report mailed May 7, 2010", 3 pgs.

"International Application Serial No. PCT/US2009/069322, Written Opinion mailed May 7, 2010", 5 pgs.

* cited by examiner

CAPACITIVE POSITION SENSOR

This application is a Continuation in Part of U.S. patent application Ser. No. 11/868,566, filed on Oct. 8, 2007, which claim the priority to U.S. Provisional Application Ser. No. 60/862,358, filed on Oct. 20, 2006, which are incorporated by reference in their entirety.

BACKGROUND OF THE INVENTION

The invention relates to capacitive position sensors, more particularly the invention relates to capacitive position sensors for detecting the position of an object around a curved path.

Capacitive position sensors are applicable to human interfaces as well as material displacement sensing in conjunction with controls and appliances, mechanisms and machinery, and computing.

Capacitive position sensors in general have recently become increasingly common and accepted in human interfaces and for machine control. In the field of home appliances, it is now quite common to find capacitive touch controls operable through glass or plastic panels. These sensors are increasingly typified by U.S. Pat. No. 6,452,514 which describes a matrix sensor approach employing charge-transfer principles. Electrical appliances, such as TV's, washing machines, and cooking ovens increasingly have capacitive sensor controls for adjusting various parameters, for example volume, time and temperature.

Due to increasing market demand for capacitive touch controls, there is an increased need for lower cost-per-function as well as greater flexibility in usage and configuration. There exists a substantial demand for new human interface technologies which can, at the right price, overcome the technical deficits of electromechanical controls on the one hand, and the cost of touch screens or other exotica on the other.

EP1273851A2 discloses a device for adjusting temperature settings, power settings or other parameters of a cooking apparatus. The device comprises a strip sensor which may be linear, curved or circular and may be a capacitive touch sensor or some other form of touch sensor. A linear display is arranged in parallel to the sensor. The capacitive touch sensor is sensitive to the touch of a finger and the display strip is made up of multiple display segments which illuminate to show the current touch setting as defined by a finger touch on the capacitive touch sensor. A predetermined calibration curve relating to a parameter to be adjusted is mapped onto the strip, the range extending from a minimum value to a maximum value. The minimum value may correspond to an off condition of the domestic appliance. Additional operational modes may be associated with the adjustment strip to ascribe new functions to the sensor strip. These can be selected by touching the display for a certain time. For example, a first additional mode can be entered by touching for 5 seconds, and a second additional mode by touching for 10 seconds. One of the additional operational modes is a zoom mode which provides for fine adjustment of the parameter value. The zoom operational mode can be activated by a contact time of, for example, 10 seconds. In the zoom mode an additional digital display is activated to show the current numerical value of the parameter being adjusted. In the zoom mode, only a fraction (e.g. 10%) of the original adjustment range is mapped onto the adjustment strip so that moving a finger across the full length of the sensor strip from left to right (or right to left) will only increase (decrease) the current setting of the parameter value, thereby providing a finer adjustment. During this fine adjustment, the display strip keeps its original function as a relative indicator of the full range between the minimum and maximum values.

More generally, linear, curved and circular sensor strips for adjusting cooker settings have been known for many years, for example see U.S. Pat. No. 4,121,204 (resistive or capacitive sensor), DE19645907A1 (capacitive sensor), DE19903300A1 (resistive sensor), and EP1602882A1 (optical sensor).

WO2006/133976A1, WO2007/006624A1 and WO2007/023067A1 are more recent examples of work on touch-sensitive control strips for domestic appliances using capacitive sensors. These three patent applications were filed before the priority date of the present application, but first published after the priority date of the present application. In particular, WO2006/133976A1 and WO2007/023067A1 disclose sensors with a zoom function similar to the above-described EP1273851A2 which is used for setting a timer.

WO2006/133976A1 provides an adjustment strip with two operational modes. In the first mode the full parameter value range is mapped across the sensor strip. For example 0 to 99 minutes in a timer function. If a user wishes to set the timer to 30 minutes, he touches the strip approximately one third way along. A parameter value of say 34 minutes is sensed by the capacitive sensor, and displayed to the user on a numeric display. Once the initial value has been set, the effect of touching the sensor field is automatically changed to a second mode in which the parameter value is decreased (or increased) finely from the initially selected value by an amount that depends on the distance moved by the finger along the sensor strip. In the example, the user can then slide his finger from right to left to reduce the time from 34 minutes to the desired 30 minutes, using the display for visual feedback. In this way, the user can initially make a rough selection of the desired parameter value with a point and touch action, and then refine it to the exact value desired by a finger sliding action.

WO2007/023067A1 provides an adjustment strip with two operational modes that switch between mapping the full parameter value range across the sensor strip and a partial range selected to show the sub-range of parameter values between which the parameter is most often set by a user. The example of setting the timer on a cooker is given.

While a zoom function is useful, prior art implementations of the zoom function have limitations regarding the manner in which the transition is effected from the full range mode to the zoom mode. In EP1273851A2, the user is made to wait for a certain time, 10 seconds in the specific example, until the transition occurs. On the other hand, in WO2006/133976A1 the transition automatically occurs as soon as a value from the full range is selected. Neither transition mode is ideal, the former can be frustratingly slow for the user, and the latter automatic transition to fine adjustment is undesirable in the case that the initial touch sets a value that is a considerable way off what is intended by the user.

SUMMARY OF THE INVENTION

The invention provides an improved capacitive position sensor for an electrical appliance in which a desired parameter value, in particular a color parameter value, can be more efficiently and accurately selected.

According to one aspect of the present invention, there is provided a capacitive position sensor for detecting a position of an object comprising: a sensing element comprising a sensing path; at least one terminal connected to the sensing element; at least one sensing channel connected to the at least one terminal in which the sensing channel is operable to generate a signal indicative of capacitance between the terminal and a system ground; means to determine a position of an object on the sensing element; and means to further refine the position of the object corresponding to a value in a parameter range of values.

More particularly, this aspect of the invention provides a capacitive position sensor for setting a parameter or function to a desired value in a range of parameter or function values by determining the position of an object on a capacitive position sensor, the capacitive position sensor comprising: a sensing element comprising a sensing path; at least one terminal connected to the sensing element; at least one sensing channel connected to the at least one terminal in which the sensing channel is operable to generate a signal indicative of capacitance between the terminal and a system ground; means to determine a position of an object on the sensing element; means to further refine the position of the object corresponding to a value in the range of parameter or function values; and a processor operable to interpret and process the signal to determine the approximate position of an object on the sensing path, the processor being configured to provide a first mode of the capacitive position sensor in which the range of parameter or function values is mapped onto the sensing path and in which the parameter or function can be set to approximately the desired value by a touch of the sensing path at a first point, and a second mode in which displacement of an object on the sensing element adjusts the parameter or function from the value initially set in the first mode, wherein the processor is configured to switch from the first mode to the second mode responsive to capacitive coupling caused by moving displacement of an object along the sensing path in relation to the first point of touch.

According to another aspect of the present invention, there is provided a method for determining the position of an object on a capacitive position sensor as hereinbefore defined, the method comprising bringing an object into proximity with the sensing element so as to determine a position of the object, initiating a change in mode of the sensor to respond to capacitive coupling caused by moving displacement of an object on the sensor element, displacing an object on the sensing element to select a value in a parameter range of values, and processing the signal to determine the selected parameter value.

More particularly, this aspect of the invention provides a method for setting a parameter or function to a desired value in a range of parameter or function values by determining the position of an object on a capacitive position sensor, the capacitive position sensor comprising: a sensing element comprising a sensing path; at least one terminal connected to the sensing element; at least one sensing channel connected to the at least one terminal in which the sensing channel is operable to generate a signal indicative of capacitance between the terminal and a system ground; means to determine a position of an object on the sensing element; and means to further refine the position of the object corresponding to a value in the range of parameter or function values, the method comprising: in a first mode of the capacitive position sensor in which the range of parameter or function values is mapped onto the sensing path bringing an object into proximity with the sensing element at a first point so as to determine a position of the object and thereby initially set the parameter or function to approximately the desired value; initiating a change in mode of the sensor from the first mode to a second mode responsive to capacitive coupling caused by moving displacement of the object along the sensing path in relation to the first point of touch of the object on the sensing element; in the second mode displacing the object on the sensing element to adjust the parameter or function from the value initially set to the desired value; and processing the signal to determine the selected parameter or function value.

In an embodiment of the invention, the capacitive sensor may work in a first mode and a second mode. In a first mode, a signal may be generated which is indicative of capacitive coupling of an object, for example a user's finger, with the sensing element. The signal generated in the first mode may provide an approximate position of an object in relation to a desired parameter value the user wishes to select. A processor may preferably be provided to interpret and process the signal to determine the approximate position of an object on the sensing element. It is preferred that in the first mode of operation, the capacitive sensor may generate a signal indicative of capacitive coupling caused by bringing an object into proximity with a desired location on the sensor or by moving displacement of the object in proximity with the sensing element.

In an embodiment of the invention, the capacitive sensor may enter a second mode of operation if moving displacement of the object in proximity with the sensing element during a first mode of operation exceeds a minimum threshold value. For example, for a sensing element in the form of a rotary capacitive sensor, if a user displaces an object in proximity with the sensing element during a first mode of operation by a minimum threshold angle in relation to a first point of touch of the object on the sensing element, the capacitive sensor may switch into a second mode of operation. The minimum threshold angle may be determined by an algorithm programmed into a microcontroller and the threshold angle may be set at different values depending on the sensitivity required and the parameter which is being adjusted. In one embodiment, the threshold angle may be set at 20 degrees before the capacitive sensor switches from the first mode to the second mode of operation. An approximate parameter value may be obtained in the first mode and in the second mode a desired parameter value may be selected.

In the second mode of operation, an object may be displaced in proximity with the sensing element by a pre-determined threshold value, for example 20 degrees, to effect an incremental change in the parameter value thereby allowing a desired specific parameter value to be selected. Advantageously, a capacitive sensor of the invention operating in a first mode may allow a parameter value to be selected (which may be the desired value, or near to the desired value, the user wishes to select) and in a second mode the sensor may effect an incremental increase or decrease of the parameter value selected in the first mode. In the second mode, a parameter value may be increased or decreased by a pre-determined amount, for example ±1 unit, ±5 units, or ±10 units, based on the number of times an object is displaced on the sensing element exceeding a pre-determined threshold value. Therefore, the threshold value may correspond to an increase or decrease of the parameter value by, say, ±1 unit, and each time the threshold value is reached (n times) the parameter value will increase or decrease by ±1 (n times ±1).

In an alternative embodiment of the invention, the capacitive sensor may enter a second mode of operation by effectively 'zooming-in' on a narrower range of parameter values, compared to the parameter range displayed in the first mode, so that a user may accurately select a desired parameter value. The narrower range of parameter values shown during the second mode will be determined by the parameter value selected in the first mode, for example plus and minus 10 units from the value selected in the first mode. In the second mode of operation, an object may be displaced along the sensing element so as to select the desired parameter value.

Preferably the processor for determining the position of an object in proximity with the sensing element in a first mode of operation may be operable for also determining the position of an object in proximity with the sensing element in a second mode of operation.

Therefore, in the invention the capacitive sensor may function in a first mode of operation in which an approximate parameter value may be selected followed by a second mode of operation in which a specific parameter value may be selected. The range of parameter values associated with the capacitive sensor (i.e. the resolution) may determine whether a desired parameter value can be selected in the first mode of operation. The second mode of operation will allow a desired parameter value to be accurately selected, for example, either by zooming-in on a narrower range of parameter values around the parameter value selected in the first mode and displacing an object in proximity with the sensing element to select the desired value, or, by displacing an object in proximity with the sensing element to exceed a pre-determined threshold value in order to change the parameter value selected from the first mode by one or more increments. The number of times the threshold value is exceeded may determine the number of times the parameter value is increased or decreased.

A capacitive sensor of the invention may be incorporated into a control panel of an electronic appliance or gadget, for example a cooking oven, microwave oven, television, washing machine, MP3 player, mobile phone, or other multimedia device. Another example is a control panel for controlling lights or the background lighting of displays, such as a dimmer function to control brightness, or aspects of the color in color lighting, such as light emitting diode (LED) lighting. The control panel for the light may be integral with the light, in a remote control unit, or wall mounted on a wall plate. A wide range of parameters/functions may be controlled by the capacitive sensor of the invention, dependent on the type of electronic appliance in which the capacitive sensor is incorporated, for example, temperature, volume, contrast, brightness, or frequency. Another example is to control color parameters, such as color hue, color saturation and color temperature in lights or displays, such as computer displays or television displays. The parameter or function to be controlled may be selected prior to use of the capacitive sensor.

Advantageously, the sensor has a higher degree of resolution in the second mode allowing a user to move their finger in proximity with the sensing element to select a specific parameter value. If the sensing element is in the form of a closed loop, a user may be able to scroll clockwise or anti-clockwise around the sensing element to select the desired value. In the second mode for example, a 20 degree rotation may be equivalent to changing a parameter value by 1 unit. The amount of rotation required by an object on the sensing element to cause an incremental change in a parameter value may be varied dependent on the parameter or function being controlled. Control circuitry or a program-controlled microprocessor may be used to control the degree of rotation required to cause a change in a parameter value.

In a preferred embodiment of the invention, the sensing element is arcuate in shape. It is particularly preferred that the sensing element is in the form of a closed loop for use in a rotary capacitive position sensor. In a rotary capacitive position sensor embodiment, an object may be moved along the sensing element of the sensor for a plurality of revolutions and the distance moved by the object may determine the output signal which is generated by the sensing channel(s).

In the first mode of operation of the capacitive sensor, capacitive coupling of an object in proximity with a sensing element may be detected to give an approximate position in relation to a range of values for a given parameter. If a user wishes to obtain different position data, the object may be removed from proximity with the sensing element and then brought into proximity with the said sensing element again. In other words, a user may initiate the first mode of the sensor again simply by retouching the sensing element. When the second mode of operation is initiated, a user may scroll the sensing element to select a specific value of a certain parameter. An output signal may be generated indicative of a specific parameter value when an object ceases displacement at a certain position on the sensing element. In an embodiment, if a user releases touch from the sensing element in a second mode and retouches the sensing element then the first mode of operation may be activated again.

In an embodiment of the invention, the capacitive position sensor may further comprise one, two or more discrete sensing areas in the centre region of a rotary sensing element. Preferably, if the sensing areas in the centre region of the sensing element sense capacitive coupling to an object, any signal produced from the sensing element is reduced or 'locked out' using the Adjacent Key Suppression™ technology described in the applicant's earlier U.S. Pat. No. 6,993,607 and U.S. application Ser. No. 11/279,402 both incorporated herein by reference. Any output signal from the rotary sensing element caused by capacitive coupling with an object may also lock out a signal from the central sensing areas.

The sensing element may be embodied by a single resistor, for example it may comprise a resistive material deposited on a substrate to form a continuous pattern. This provides for an easy-to-fabricate resistive sensing element which can be deposited on the substrate in any one of a range of patterns. Alternatively, the sensing element may be made from a plurality of discrete resistors. The discrete resistors may be alternately connected in series with a plurality of conducting sense plates, the sense plates providing for increased capacitive coupling between the object and the resistive sensing element. This provides for a resistive sensing element which can be fabricated from widely available off-the-shelf items. The disclosure of WO2005/019766 is incorporated herein by reference as an example of the capacitance measurement circuitry which may be used. Alternatively, a resistor-less sensing element similar to that described in U.S. Pat. No. 4,264,903 may be used to form the capacitive sensor of the invention.

The resistive sensing element may have a substantially constant resistance per unit length. This provides for a capacitive position sensor having a simple uniform response. Where greater positional resolution is required and/or when employing a relatively long resistive sensing element, the resistive sensing element may include a plurality of terminals.

The object to be detected may be a pointer, for example a finger or a stylus, which can be freely positioned by a user. Alternatively, the object may be a wiper held in proximity to the resistive sensing element, the position of the wiper along the resistive sensing element being detected by the capacitive position sensor. The position of the wiper may be adjusted by a user, for example by turning a rotary knob, or may be coupled to a shaft driven by connected equipment such that the capacitive position sensor can act as an encoder.

Further objects of some embodiments of the invention are to provide for a sensor having high reliability, a sealed surface, low power consumption, simple design, ease of fabrication, and the ability to operate using off-the-shelf logic or microcontrollers.

In U.S. Pat. No. 6,466,036, the applicant teaches a capacitive field sensor employing a single coupling plate to detect change in capacitance to ground. This apparatus comprises a circuit employing repetitive charge-then-transfer or charge-plus-transfer cycles using common integrated CMOS push-pull driver circuitry. This technology forms the basis of some embodiments of the invention and is incorporated by reference herein.

Some definitions are now made. 'Element' refers to the physical electrical sensing element made of conductive substances. 'Electrode' refers to one of the galvanic connection points made to the element to connect it to suitable driver/sensor electronics. The terms 'object' and 'finger' are used synonymously in reference to either an inanimate object such as a wiper or pointer or stylus, or alternatively a human finger or other appendage, any of whose presence adjacent the element will create a localized capacitive coupling from a region of the element back to a circuit reference via any circuitous path, whether galvanically or non-galvanically. The term 'touch' includes either physical contact between an object and the element, or, proximity in free space between object and element, or physical contact between object and a dielectric (such as glass) existing between object and element, or, proximity in free space including an intervening layer of dielectric existing between object and element. Hereinafter the terms 'circle' or 'circular' refer to any ellipsoid, trapezoid, or other closed loop of arbitrary size and outline shape having an open middle section.

BRIEF DESCRIPTION OF THE DRAWINGS

The invention will now be described by way of example only with reference to the embodiments described and shown in the drawings.

DETAILED DESCRIPTION OF THE INVENTION

Figure 1:
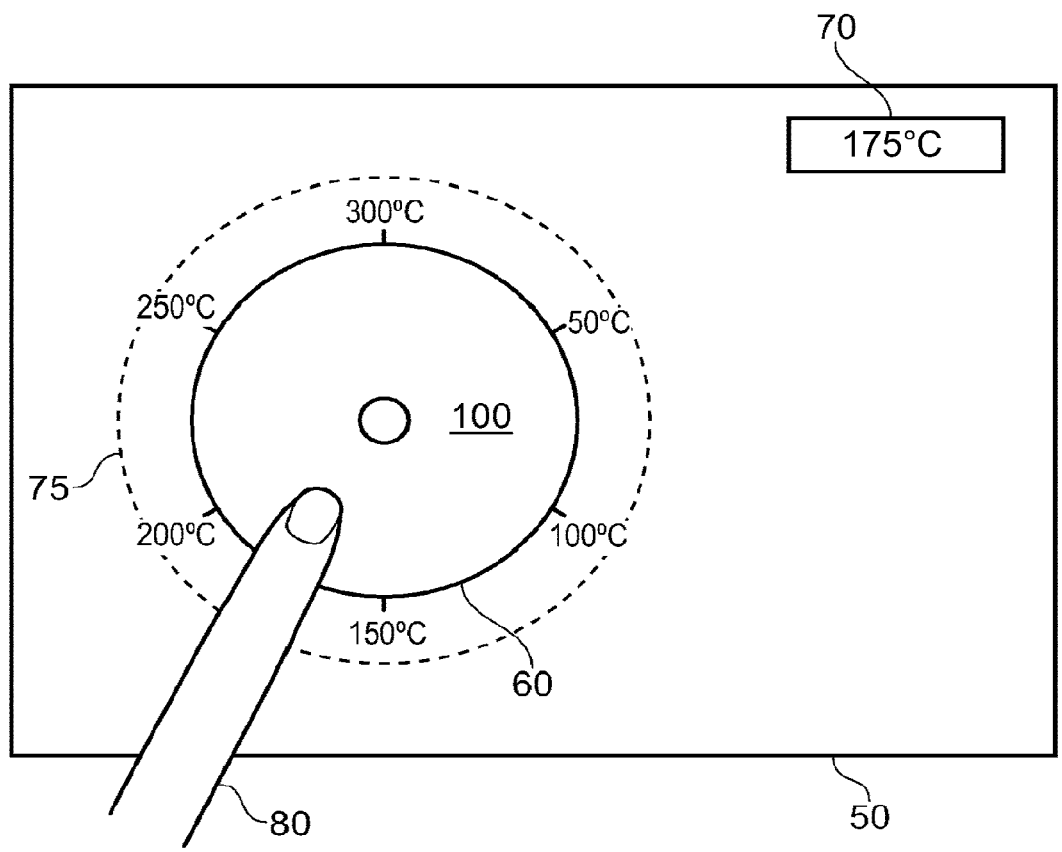
FIG. 1 shows a control panel of an apparatus embodying a rotary capacitive sensor, the sensor being used in a first mode of operation.

FIG. 1 illustrates part of a control panel 50 having a capacitive sensor 60 and a digital readout display 70. The control panel 50 may be incorporated into an electronic appliance such as a cooking oven, microwave oven, washing machine, fridge freezer, television, MP3 player, mobile telephone or the like. The parameter or function to be controlled by the capacitive sensor will depend on the type of electrical appliance in which the capacitive sensor is incorporated. Parameters like volume, temperature, operating program, brightness, contrast are some examples of functions that may be controlled by the capacitive sensor of the invention. In a preferred embodiment of the invention, the parameter to be controlled may be chosen from a pre-determined list of parameters so that a user may advantageously adjust different parameters on an electrical appliance or apparatus. The capacitive sensor 60 shown in FIG. 1 is set to control cooking temperature of a microwave or cooking oven.

The capacitive sensor 60 comprises a rotary sensing element 100 for detecting capacitive coupling with an object, typically an operator's finger. A Liquid Crystal Display 75 (or other known display) is formed in the control panel 50 to illuminate the temperature scale around the sensing element. The temperature scale ranges from 0 to 300 degrees Centigrade. The capacitive sensor 60 is shown in a first mode of operation in which a user's finger is used to select a cooking temperature. A user's finger 80 is shown in proximity with a portion of the sensing element 100 corresponding to a temperature of 175 degrees Centigrade (° C.) which is displayed on the digital readout display 70. The selected temperature of 175° C. may be the desired temperature required by the user, but in most cases the temperature selected in the first mode of operation will indicate a temperature near to the actual temperature required by the user. A user may re-touch the sensing element 100 of the sensor to reactivate the first mode of operation and select a different temperature. The resolution of the sensor may determine how close the temperature selected in the first mode is to the desired temperature sought by the user.

Figure 2A:
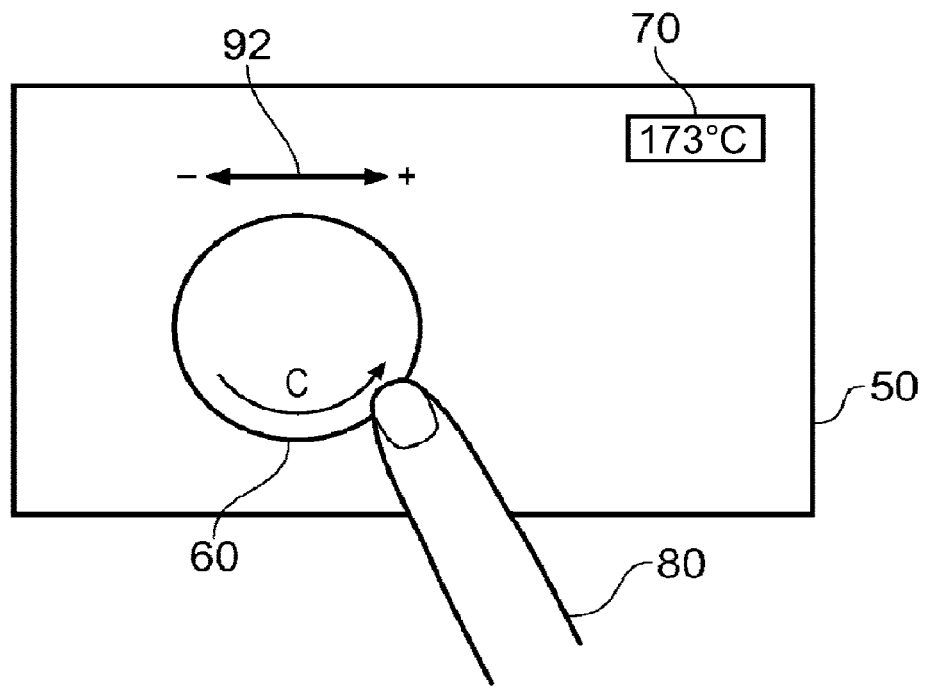
FIG. 2a shows the capacitive sensor of FIG. 1 being used by in a second mode of operation, with the user scrolling around the sensor in an anti-clockwise direction.
Figure 2B:
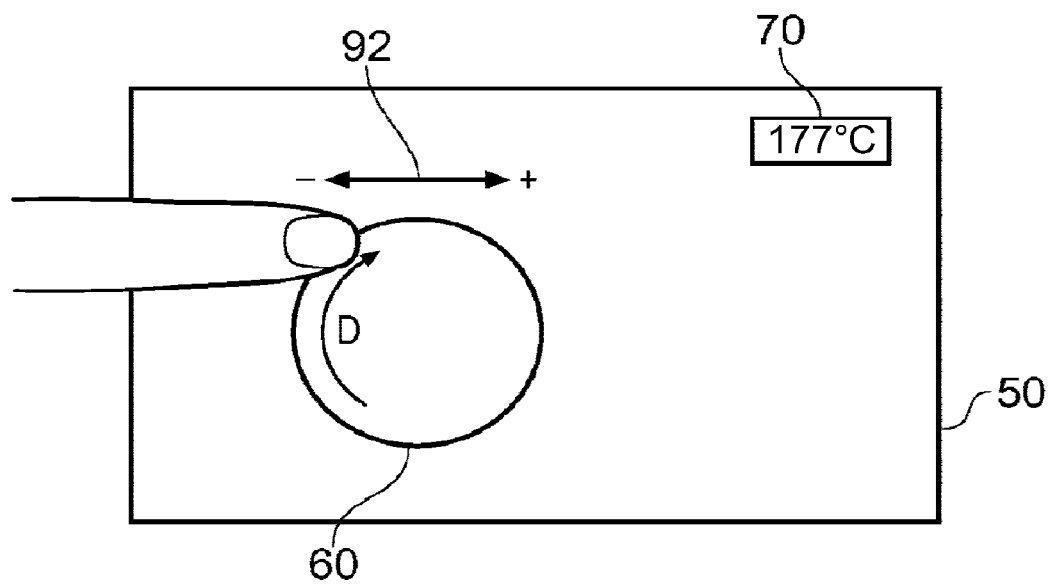
FIG. 2b shows the capacitive sensor of FIG. 1 being used in a second mode of operation, with the user scrolling around the sensor in a clockwise direction.

Turning now to FIGS. 2A and 2B, the capacitive sensor 60 is shown in a second mode of operation. The capacitive sensor automatically enters the second mode of operation after a temperature has been selected in the first mode of operation. In the second mode, a user is able to increase or decrease the temperature selected in the first mode by a pre-determined increment. Changing the temperature by a given increment depends on a user displacing their finger in proximity with the sensing element 100 by a pre-determined threshold angle. The embodiment shown in FIGS. 2A and 2B requires a 20° rotation (i.e. threshold angle is 20°) to effect a temperature change of ±1° C.

As shown in FIG. 2A, a user has displaced their finger in proximity with the sensing element 100 in an anti-clockwise direction to decrease the temperature of 175° C. selected in the first mode. The user has moved his finger by 40° (i.e. 2× the threshold angle) from the first point of touch in the first mode of operation, to cause a temperature decrease by 2° C. to 173° C. (shown by arrow C). As shown in FIG. 2B, the user has moved his finger by 40° in a clockwise direction from the first point of touch in the first mode of operation, to cause a temperature increase by 2° C. to 177° C. (arrow D). Advantageously, the capacitive sensor in the second mode of operation allows a user to accurately select a desired temperature. The resolution of the capacitive sensor in the second mode of operation is typically finer than that in the first mode of operation. The threshold angle may be re-settable and is typically determined by a program stored in a microcontroller.

In the second mode of operation as illustrated in FIGS. 2A and 2B, a + and − indicator display 92 is present above the capacitive sensor 60 to indicate to the user that the temperature can be increased or decreased by 1 unit(s). The digital display 70 shows the temperature as it is changed by the user. The LCD 75 showing the temperature scale in the first mode is no longer highlighted during the second mode of operation.

Figure 3:
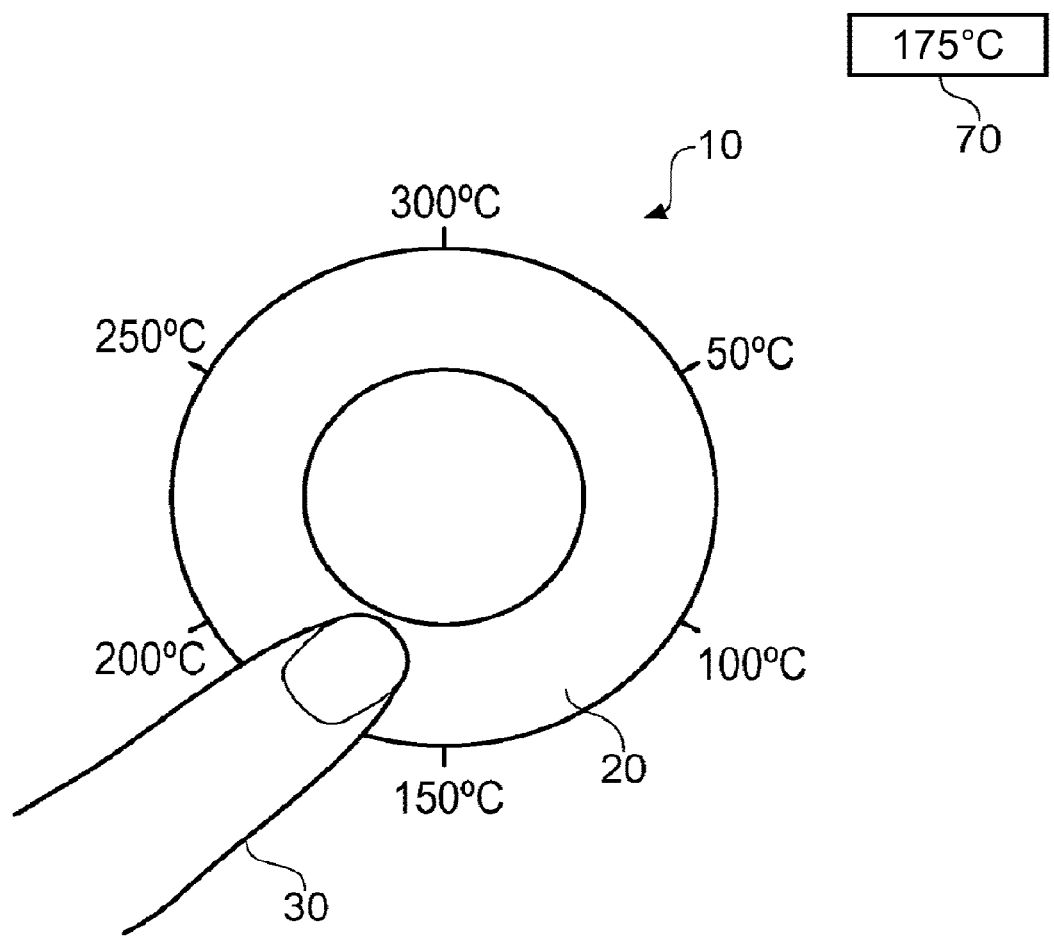
FIG. 3 shows a control panel of an apparatus according to another embodiment, in which a rotary capacitive sensor is being used in a first mode of operation.

FIG. 3 illustrates a rotary sensing element 20 of a capacitive position sensor 10 embodying the invention. The capacitive sensor 10 is incorporated into a control panel of a cooking oven. The capacitive sensor 10 shown in FIG. 1 is used to select a desired cooking temperature, although the sensor could be used for selecting any particular parameter value based on the electrical appliance in use. The sensor of FIG. 1 is shown in a first mode of operation. A user's finger 30 approaches the rotary sensing element 20 and is capacitively coupled to the sensing element in the region between 150 to 200° C. A temperature of 175° C. is shown in the digital display 70. The first mode of operation of the sensor allows the user to select an approximate cooking temperature. The rotary sensing element 20 may have a diameter of about 2 inches which, prior to the invention, may make it difficult for a user to accurately select a certain temperature.

Figure 4:
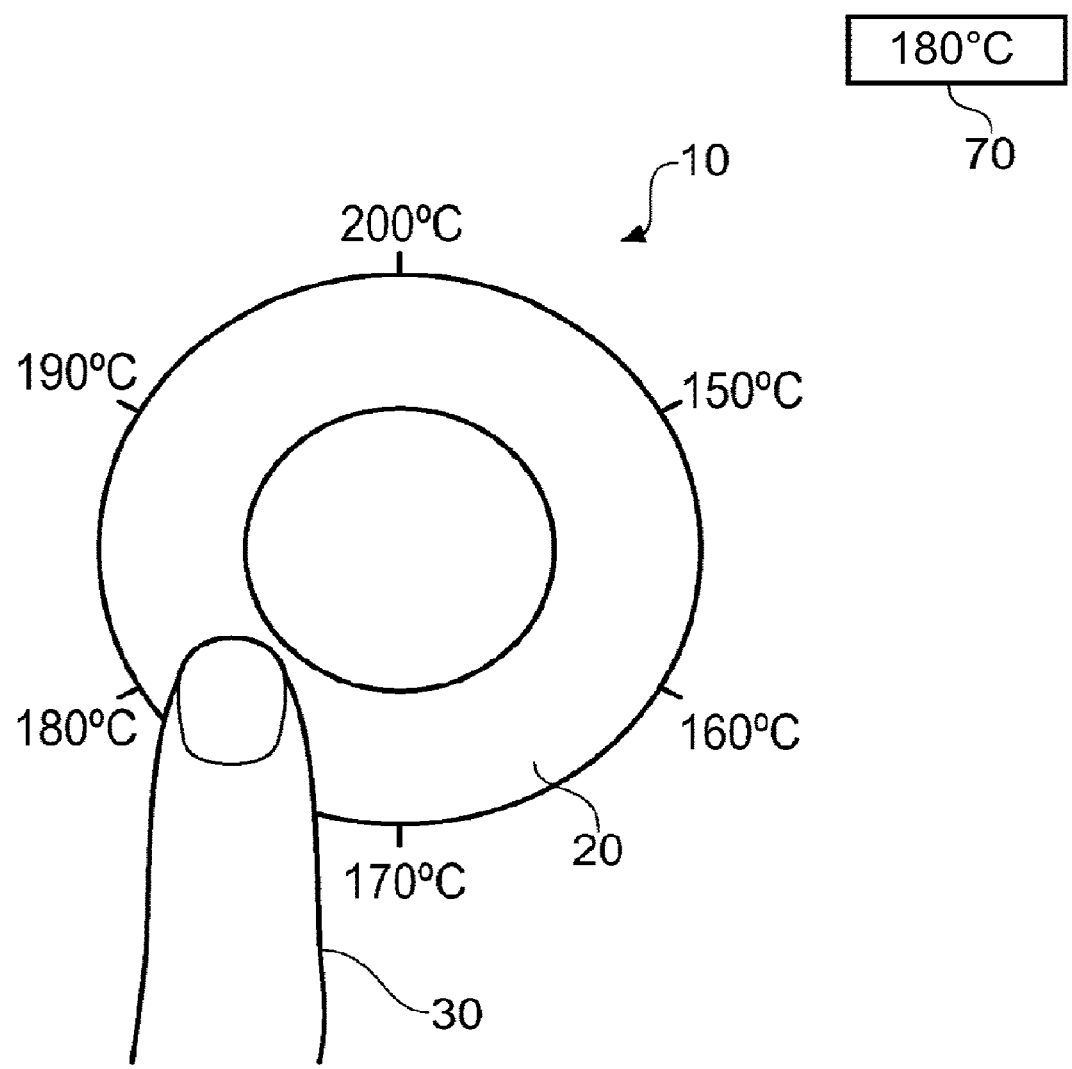
FIG. 4 shows the capacitive sensor of FIG. 3 being used in a second mode of operation.

The capacitive sensor 10 automatically enters a second mode of operation after a temperature has been selected in the first mode, as illustrated in FIG. 4. As shown in FIG. 4, the temperature scale around the sensing element 20 has been modified or reset to expand the temperature range in the capacitively coupled region determined from the first mode of operation. The user may now select a desired temperature for cooking by scrolling his finger clockwise or anticlockwise around the sensing element until the desired temperature is reached, in this case 180° C. as shown on the digital display 70. The temperature scale illustrated in FIG. 4 is only an example of how the capacitive sensor may be programmed to zoom in on a pre-determined temperature range. In the second mode of operation, the number of degrees of rotation required to effect a temperature change by a certain increment may be adjusted. The temperature selected may be displayed on an analogue or digital readout display formed within the control panel, such as on digital display 70.

Figure 5A:
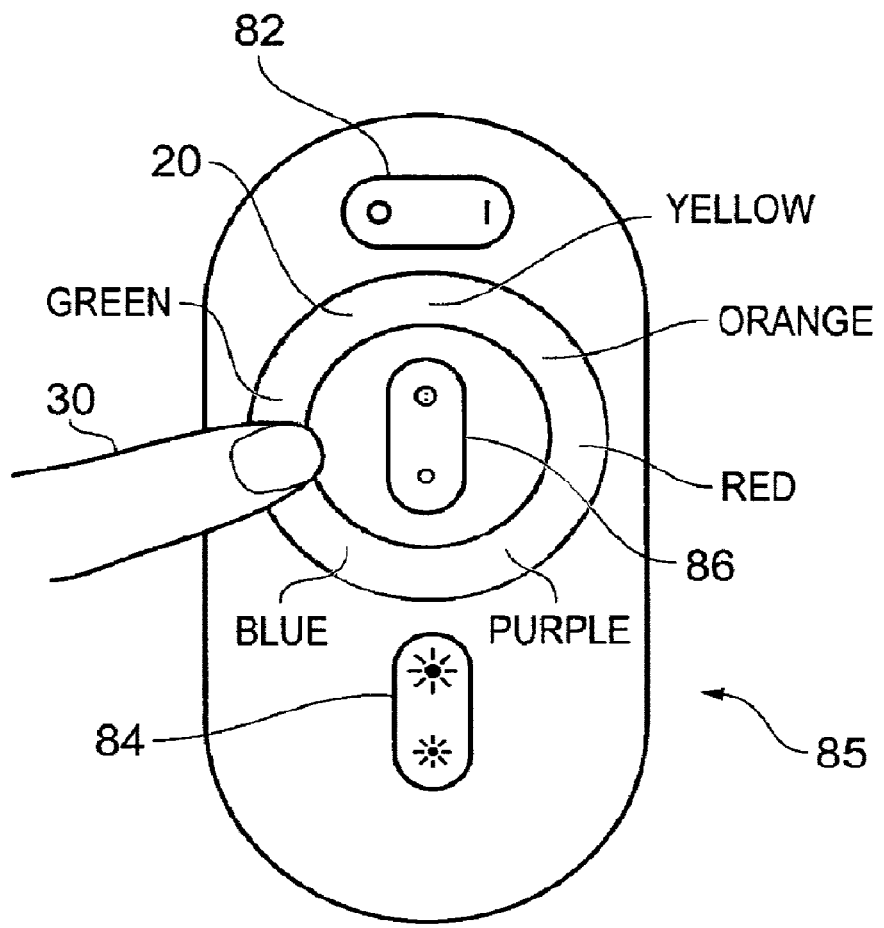
FIG. 5A shows a lighting controller according to a further embodiment and incorporating a control panel with a rotary capacitive sensor according to the invention.
Figure 5B:
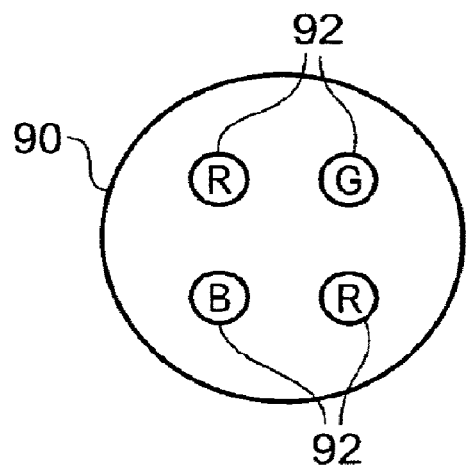
FIG. 5B shows a color light unit controllable by the lighting controller of FIG. 5A.

FIG. 5A shows a hand-held lighting controller 85 according to a further embodiment. FIG. 5B shows a color light fitting 90 controllable by the lighting controller. The light is an LED light incorporating red, green and blue LEDs 92. In the illustrated unit, there are two red LEDs, one green and one blue to provide equal maximum brightness of each color. The lighting controller 85 is a hand-held unit with conventional built-in infrared or radio frequency transmitter for wireless communication with the light 90.

The controller 85 incorporates a flat control panel that accommodates a number of capacitive sensors. A circular "wheel" rotary capacitive sensor 20 is provided, which is preferably recessed in the housing to provide location for a user's finger 30. A pair of capacitive button sensors 86 are located centrally within the wheel. In addition, two further pairs of button sensors 82 and 84 are provided outside the rotary capacitive sensor. Button pair 82 function as on/off switches for the light. Button pair 84 control brightness of the light. Button pair 86 located inside the wheel control color saturation. The button pairs 84 and 86 are used to adjust the parameters of brightness and saturation over a linear range, with adjustment taking place within the allowed range according to the duration of a touch on either button of the pair. Specifically, the upper button of button pair 84 is used to increase brightness and the lower button to decrease brightness. Further, the upper button of button pair 86 is used to adjust saturation towards pure color and the lower button towards white. The wheel is marked to show the color wheel or color circle as indicated by the text labelling.

The light 90 is controlled initially in a first mode of operation to produce the color hue of light as defined by the position of a sensed touch on the sensor 20. For example, blue-green as illustrated when a touch of the wheel is sensed at approximately 9 o'clock, purple at 5 o'clock etc. This is achieved in the light unit 90 by appropriate driving of the LEDs as is well known in the art. Once a touch is sensed and the initial color hue set, the capacitive sensor 20 automatically enters a second mode of operation, in which further sliding motion of the user's finger 30 around the sensor wheel provides fine adjustment of color hue according to the color circle. In this way, a user can conveniently produce light of any desire hue or saturation level as desired in an intuitive manner. In alternative configurations of this embodiment, the wheel can be assigned other color parameters, such as color hue, color saturation, or color temperature. In respect of color temperature, it is noted that LED light assemblies are known in the art in which the color temperature is adjustable, e.g. to vary light ambience. Moreover, it will be understood that control of color is not only useful for lighting assemblies, but may also be used in other devices, such as display screens.

Although the present invention has been described with respect to preferred embodiments, many modifications and alterations can be made without departing from the invention. Accordingly, it is intended that all such modifications and alterations be considered as within the spirit and scope of the invention.

What is claimed is:

1. A capacitive position sensor for setting a parameter or function to a desired value in a range of parameter values by determining the position of an object on a capacitive position sensor, the capacitive position sensor comprising:
   a sensing element comprising a sensing path;
   at least one terminal connected to the sensing element;
   at least one sensing channel connected to the at least one terminal in which the sensing channel is operable to generate a signal indicative of capacitance between the terminal and a system ground;
   means to determine a position of an object on the sensing element;
   means to further refine the position of the object corresponding to a value in the range of parameter values; and
   a processor operable to interpret and process the signal to determine a position of an object on the sensing path, the processor being configured to provide a first mode of the capacitive position sensor in which the range of parameter values is mapped onto the sensing path and to set a parameter to approximately the desired value by a touch of the sensing path at a first point, and a second mode in which displacement of the object on the sensing element adjusts the parameter from the value initially set in the first mode, wherein the processor is configured to switch from the first mode to the second mode responsive to capacitive coupling caused by moving displacement of the object along the sensing path in relation to the first point of touch, and wherein the parameter being controlled by the capacitive position sensor is an aspect of color,
   wherein the aspect of color is selected from color hue, color saturation, and color temperature.

2. The sensor of claim 1, wherein the sensing path is formed as a closed loop.

3. The sensor of claim 1, wherein the processor requires a displacement of the object to exceed a minimum threshold value in order to initiate a change in mode of the processor from the first mode to the second mode.

4. The sensor of claim 1, wherein, in the second mode, the processor effects an incremental change in the parameter value when it is sensed that the object has moved along the sensing path by a pre-determined threshold displacement.

5. The sensor of claim 1, wherein, in the second mode, the processor changes the parameter value by a number of units based on the number of times the object displacement along the sensing path is sensed to have exceeded the pre-determined threshold displacement.

6. The sensor of claim 1, wherein, in the second mode, the processor maps a narrower sub-range of the range of parameter values onto the sensing path around the value of the parameter initially set in the first mode.

7. The sensor of claim 1, wherein the processor is further configured such that if a release of touch from the sensing element in the second mode followed by a subsequent re-touching of the sensing element is sensed, then the first mode is activated.

8. The sensor of claim 1, wherein the processor is configured to allow selection of the parameter prior to use of the capacitive position sensor.

9. A control panel of an electronic appliance incorporating a capacitive position sensor according to claim 1.

10. An electronic appliance having a control panel incorporating a capacitive position sensor according to claim 1.

11. The electronic appliance of claim 10 selected from a cooking oven, microwave oven, television, washing machine, MP3 player, mobile phone, and multimedia device.

12. A method for setting a parameter to a desired value in a range of parameter values by determining the position of an object on a capacitive position, sensor, the capacitive position sensor comprising: a sensing element comprising a sensing path; at least one terminal connected to the sensing element; at least one sensing channel connected to the at least one terminal in which the sensing channel is operable to generate a signal indicative of capacitance between the terminal and a system ground; means to determine a position of an object on the sensing element; and means to further refine the position of the object corresponding to a value in the range of parameter or function values, the method comprising:

in a first mode of the capacitive position sensor in which the range of parameter values is mapped onto the sensing path bringing an object into proximity with the sensing element at a first point so as to determine a position of the object and thereby initially set the parameter to approximately the desired value;

initiating a change in mode of the sensor from the first mode to a second mode responsive to capacitive coupling caused by moving displacement of the object along the sensing path in relation to the first point of touch of the object on the sensing element;

in the second mode displacing the object on the sensing element to adjust the parameter from the value initially set to the desired value; and processing the signal to determine the parameter value, wherein the parameter being controlled by the capacitive position sensor is an aspect of color selected from the group consisting of color hue, color saturation, and color temperature.

13. The method of claim 12, wherein the sensing path is formed as a closed loop.

14. The method of claim 12, wherein said moving displacement is required to exceed a minimum threshold value in order to initiate a change in mode of the sensor from the first mode to the second mode.

15. The method of claim 12, wherein, in the second mode, an incremental change in the parameter value is effected by the object moving along the sensing path by a pre-determined threshold displacement.

16. The method of claim 12, wherein, in the second mode, the parameter value is changed by a number of units based on the number of times the object displacement along the sensing path exceeds the pre-determined threshold displacement.

17. The method of claim 12, wherein, in the second mode, a narrower subrange of the range of parameter values is mapped onto the sensing path around the value of the parameter or function initially set in the first mode.

18. The method of claim 12, wherein releasing touch from the sensing element in the second mode and then re-touching the sensing element causes the first mode to be activated again.

19. The method of claim 12, wherein the parameter is selectable prior to use of the capacitive position sensor.

20. A sensor comprising:
a sensing element comprising a sensing path having a length;
at least one sensing channel operable to generate a signal indicative of capacitance between the sensing path and a system ground;
a processor having a first mode and a second mode, the processor configured to determine a first position of an object along the sensing path using the signal and to set a parameter to an initial value in the first mode, wherein the initial value is a function of the first position along the sensing path and to a range of parameter values associated with the length of the sensing path, the processor further configured to adjust the parameter in a second mode in response to a displacement of the object along the sensing path from the first position, wherein the processor is configured to switch from the first mode to the second mode when the signal indicates displacement of the object proximate the sensing element and along the sensing path, and
wherein the processor uses the value of the parameter value to control at least one aspect of color selected from the group consisting of color hue, color saturation, and color temperature.

21. The sensor of claim 20, wherein the sensing path is formed as a closed loop.

22. The sensor of claim 21, wherein the sensing path is curved.

23. The sensor of claim 20, wherein the processor is configured to change from the first mode to the second mode when the displacement of the object exceeds a minimum threshold displacement.

24. The sensor of claim 20, wherein, in the second mode, the processor maps a sub-range of parameter values onto the sensing path, the sub-range of parameter values substantially centered about the initial value set in the first mode.

25. The sensor of claim 20, wherein, in the second mode, the processor is configured to incrementally change the parameter value when the signal indicates that the object has moved along the sensing path by a pre-determined threshold displacement from the first point.

* * * * *

UNITED STATES PATENT AND TRADEMARK OFFICE
CERTIFICATE OF CORRECTION

| | | |
|---|---|---|
| PATENT NO. | : 7,830,160 B2 | Page 1 of 1 |
| APPLICATION NO. | : 12/317305 | |
| DATED | : November 9, 2010 | |
| INVENTOR(S) | : Harald Philipp | |

It is certified that error appears in the above-identified patent and that said Letters Patent is hereby corrected as shown below:

On the Title page, in Item (73), in "Assignee", in column 1, line 1, delete "Atmel," and insert -- Atmel --, therefor.

In column 11, line 20, in Claim 12, delete "position, sensor," and insert -- position sensor, --, therefor.

Signed and Sealed this
Eighteenth Day of January, 2011

David J. Kappos
*Director of the United States Patent and Trademark Office*